United States Patent [19]

Wong et al.

[11] Patent Number: 5,732,020

[45] Date of Patent: Mar. 24, 1998

[54] CIRCUITRY AND METHODS FOR ERASING EEPROM TRANSISTORS

[75] Inventors: Myron Wong; John Costello, both of San Jose, Calif.

[73] Assignee: Altera Corporation, San Jose, Calif.

[21] Appl. No.: 717,775

[22] Filed: Sep. 24, 1996

Related U.S. Application Data

[60] Provisional application No. 60/019,579, Jun. 12, 1996.
[51] Int. Cl.[6] .............................. G11C 11/34; G11C 7/00
[52] U.S. Cl. ........................ 365/185.25; 365/185.26; 365/185.29; 365/185.33; 365/218
[58] Field of Search ................... 365/185.25, 185.26, 365/185.29, 185.33, 218

[56] References Cited

U.S. PATENT DOCUMENTS

| | | | |
|---|---|---|---|
| 5,428,568 | 6/1995 | Kobayashi et al. | 365/185.26 |
| 5,491,657 | 2/1996 | Haddad et al. | 365/185.26 |
| 5,625,211 | 4/1997 | Kowshik | 365/185.26 |

*Primary Examiner*—David C. Nelms
*Assistant Examiner*—Trong Quang Phan
*Attorney, Agent, or Firm*—Fish & Neave; Robert R. Jackson; G. Victor Treyz

[57] ABSTRACT

Circuitry and methods for performing a global erase of an array of electrically-erasable programmable read-only memory (EEPROM) transistors are provided. The voltages used to erase the EEPROM transistors are controlled so that the maximum voltage across the gate oxide of previously erased transistors in the array does not exceed a predetermined maximum acceptable voltage level, thereby avoiding gate oxide damage due to high electric fields.

10 Claims, 2 Drawing Sheets

5,732,020

CIRCUITRY AND METHODS FOR ERASING EEPROM TRANSISTORS

This application claims the benefit of U.S. provisional application No. 60/019,579, filed Jun. 12, 1996.

BACKGROUND OF THE INVENTION

This invention relates to electrically erasable programmable memory (EEPROM) transistors, and more particularly, to techniques for globally erasing EEPROM transistors without subjecting the gate oxides in such transistors to excessive electrical fields.

EEPROM transistor arrays are used in programmable logic devices, memories, and digital circuits that use blocks of programmable memory. When electrons are removed from the floating gate of an EEPROM transistor, the transistor is said to be "programmed." In the programmed state, the EEPROM transistor will conduct in response to a voltage control signal that is normally applied to the control gate of the transistor. When electrons are injected onto the floating gate of an EEPROM transistor, the transistor is said to be "erased." In the erased state, a negative voltage on the floating gate prevents the transistor from conducting, even when the normal bias voltage is applied to the control gate. A transistor may be placed in series with each EEPROM transistor in an array for selecting the EEPROM transistor, while the control gate is biased to a desired level. Various logic functions can be implemented by an EEPROM array by selectively programming and erasing EEPROM transistors in the array.

Typically, the EEPROM transistors in an array are programmed individually, whereas the process of erasing transistors in an array is carried out globally. To perform a conventional global erase, a high voltage is applied to the control gates of each of the transistors. A high voltage is also applied to the source lines connected to the transistors in the array. Applying these voltages to the transistors couples their floating gates to a positive voltage, generating sufficient electrical field across the tunnel oxide to inject electrons onto the floating gates of all previously programmed transistors, thereby erasing them.

However, because the source line and control gate erase voltages are applied globally to all of the transistors in the array, some of the previously erased transistors in the array are also exposed to global erase voltages. In conventional global erase processes, the source line erase voltage is applied prior to the control gate erase voltage. When the source line voltage is applied to the source of a previously erased EEPROM transistor, a high electric field appears across the gate oxide of the transistor, which may damage the oxide. Newer EEPROM transistor designs with gate oxides thicknesses of less than approximately 125 Å are particularly susceptible to gate oxide damage due to excessive electric fields that are generated in this way. Using thicker gate oxides to reduce the risk of damage reduces transconductance, resulting in lower cell current or larger cell sizes.

It is therefore an object of the present invention to provide a method for performing global erases of EEPROM transistor arrays that does not subject previously erased transistors to unacceptably large electric fields across their gate oxides.

It is further object of the present invention to provide circuitry for performing global erases of EEPROM transistor arrays that does not subject previously erased EEPROM transistors to unacceptable large electric fields across their gate oxides.

SUMMARY OF THE INVENTION

These and other objects of the invention are accomplished in accordance with the principles of the present invention by providing circuitry and methods for performing a global erase of an array of electrically-erasable programmable read-only memory (EEPROM) transistors in which the maximum voltage across the gate oxides of previously erased transistors does not exceed a predetermined maximum acceptable voltage level, thereby preventing gate oxide damage due to excessive electric fields. A control gate erase voltage is applied to the control gates of the transistors and a source line erase voltage is applied to the sources of the transistors during erasing. The magnitude of the source line erase voltage is preferably proportional to the control gate erase voltage during the portion of the erase process in which the erase voltages that are applied to the control gates and sources are ramped up. Circuitry is provided for generating the source line erase voltage based directly on the voltage output of the circuitry used to generate the control gate erase voltage.

During the portion of the erase process in which the erase voltages are removed from the control gates and sources, the source voltage is preferably not removed until the magnitude of the control gate erase voltage has been lowered to match that of the source line erase voltage. After the control gate erase voltage has been lowered to that of the source line erase voltage, the control gate and source line erase voltages can be removed from the control gates and sources concurrently.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
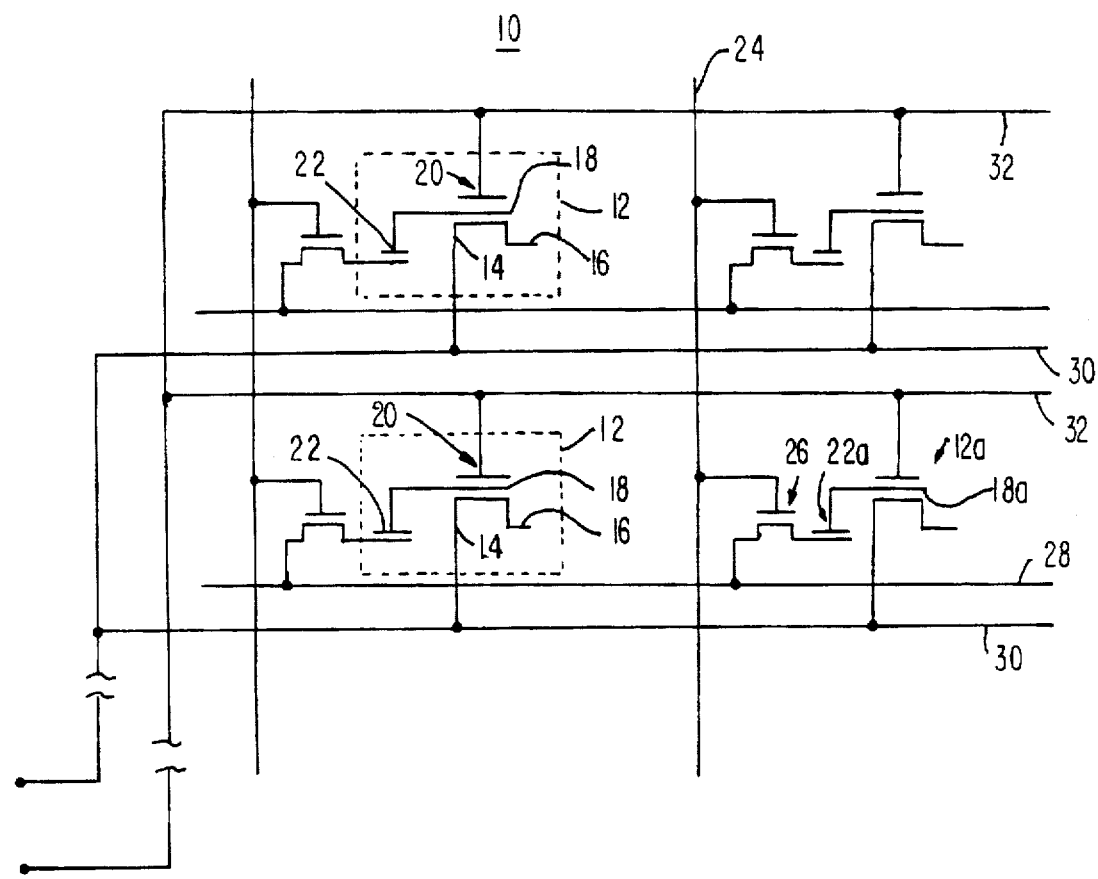
FIG. 1 is a circuit diagram of a portion of an EEPROM transistor array.

A typical EEPROM transistor array 10 having rows and columns of EEPROM transistors 12 is shown in FIG. 1. EEPROM transistors 12 each have source 14, drain 16, floating gate 18, and control gate 20. In addition, each EEPROM transistor 12 has an associated tunnel node 22. Array 10 is simplified to avoid over-complicating the drawing. For example, the control lines used to read out data stored on transistors 12 during normal operation of array 10 are not shown.

When electrons are removed from floating gates 18 of transistors 12, floating gates 18 acquire a positive voltage bias and transistors 12 are said to be "programmed." In the programmed state, EEPROM transistors 12 turn on and off normally in response to voltage control signals applied to control gates 20. When electrons are injected onto floating gates 18, transistors 12 are said to be "erased." In the erased state, negative voltages on floating gates 18 prevent control gates 20 from turning on transistors 12, even when voltage bias signals are applied to control gates 20.

Transistors 12 are typically programmed individually and erased globally. To program transistor 12a, vertical line 24 is taken to a high voltage level, turning transistor 26 on. At the same time, a high voltage is applied to horizontal line 28.

Turning transistor 26 on and taking horizontal line 28 high removes electrons from floating gate 18a via tunnel node 22a. The removal of electrons from floating gate 18a raises the voltage of floating gate 18a to approximately 2.5 V, thereby programming transistor 12a.

To perform a conventional global erase of array 10, a source line erase voltage of approximately 7 V is applied to sources 14 via source lines 30. A control gate erase voltage of approximately 15 V is subsequently applied to control gates 20 via control gate lines 32. Applying these erase voltages to transistors 12 adds electrons to floating gates 18 of all previously programmed transistors 12, thereby erasing them. The states of floating gates 18 in transistors 12 that were already erased are unchanged.

However, applying the source line erase voltage to previously erased transistors 12 prior to the application of the control gate erase voltage can cause large voltages and therefore large electric fields to develop across the gate oxides of previously erased transistors 12. (Gate oxides are shown schematically in FIG. 1 as the gap between floating gates 18 and the horizontal lines connecting sources 14 and drains 16.)

The magnitude of the voltage drop across the gate oxide for a typical EEPROM transistor is given by Equation 1.

$$V_{S-FG} = V_S - V_{FG} - \Delta V_{FG(SOURCE)} - \Delta V_{FG\ (GATE)} \quad (1)$$

The voltage across the gate oxide is $V_{S-FG}$ (the voltage between source 14 and the floating gate 18). $V_S$ is the voltage on source 14 and $V_{FG}$ is the voltage on floating gate 18. $\Delta V_{FG(SOURCE)}$ is the voltage induced on floating gate 18 as a result of capacitive coupling from source 14. $\Delta V_{FG(GATE)}$ is the voltage induced on floating gate 18 as a result of capacitive coupling from control gate 20. The value of $\Delta V_{FG(SOURCE)}$ is given by equation 2.

$$\Delta V_{FG(SOURCE)} = C_1 V_S \quad (2)$$

$C_1$ is the source to floating gate coupling ratio for transistors 12, which is the ratio of the capacitance due to the overlap between floating gate 18 and source 14 to the total capacitance of floating gate 18. A typical value for $C_1$ is 0.1. The value of $\Delta V_{FG(SOURCE)}$ is given by equation 3.

$$\Delta V_{FG(GATE)} = C_2 V_G \quad (3)$$

$C_2$ is the control gate to floating gate coupling ratio for transistors 12, which is the ratio of the capacitance due to the overlap between floating gate 18 and control gate 20 to the total capacitance of floating gate 18. A typical value for $C_2$ is 0.7.

For a transistor 12 that is already in an erased state prior to a global erase, $V_G$ is typically −5 V. After the source line erase voltage of 7 V is applied to initiate the global erase, but before the control gate erase voltage of 15 V is applied, $V_S$ is 7 V, $V_G$ is 0 V, $\Delta V_{FG(SOURCE)}$ is 0.7 V, and $\Delta V_{FG(GATE)}$ is 0 V. The value of $V_{S-FG}$ given by Equations 1–3 is therefore 11.3 V. For gate oxide thicknesses of 125 Å and less, values of $V_{S-FG}$ greater than 9 V can cause damage to the gate oxide. Accordingly, conventional global erase techniques can subject the gate oxides of previously erased transistors in an array to excessive electric fields.

In accordance with the present invention, EEPROM arrays such as array 10 are globally erased without subjecting previously erased transistors 12 in array 10 to excessive electric fields across their gate oxides. The gate oxides of erased transistors 12 are protected during global erasing by maintaining the maximum voltage developed between floating gate 18 and source 14 below the level that could potentially cause gate oxide damage. For a gate oxide thickness of 125 Å, the maximum acceptable voltage level across the gate oxide is approximately 9 V. For thinner gate oxides, the maximum acceptable voltage is reduced.

Figure 2:
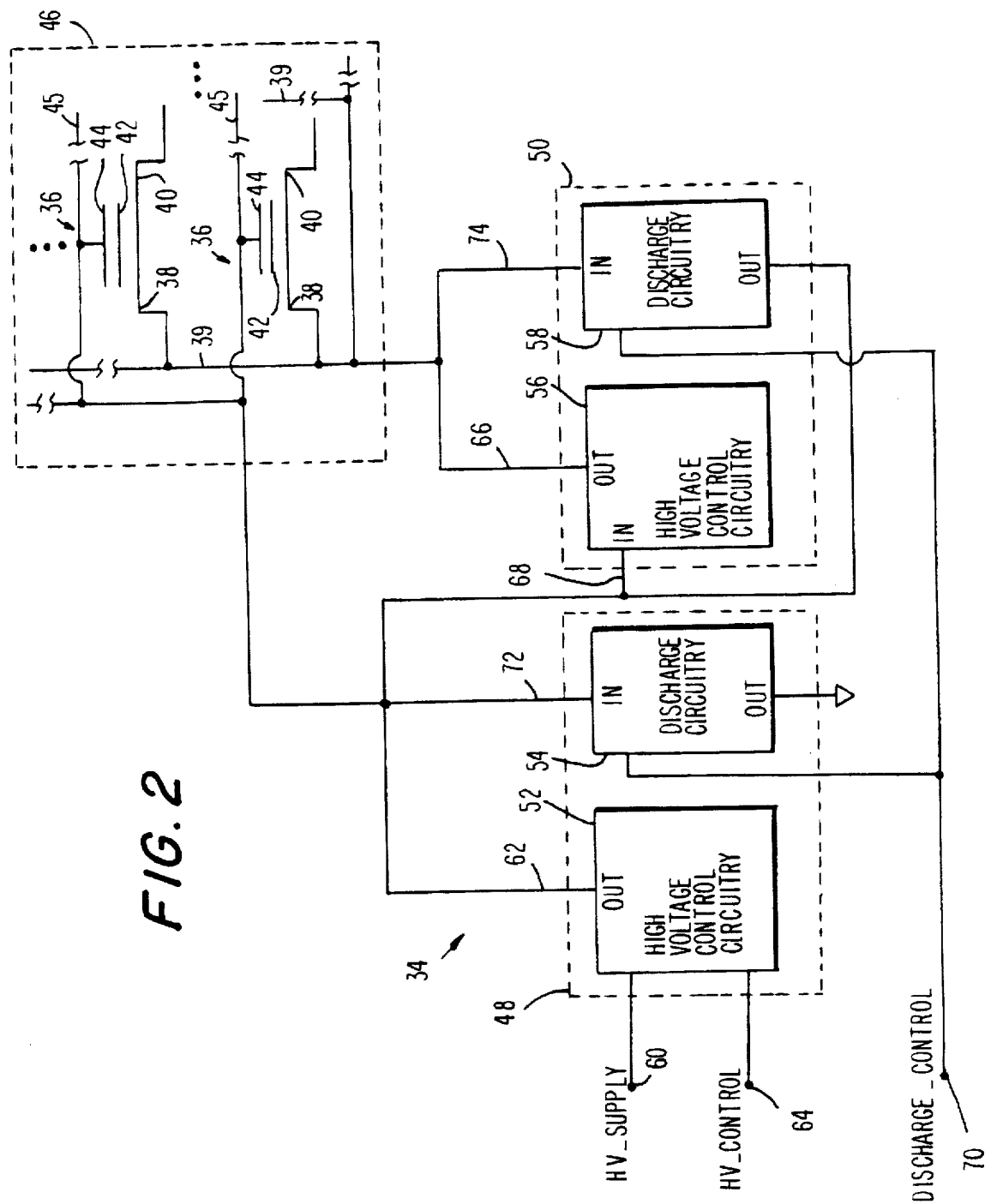
FIG. 2 shows circuitry for performing a global erase in accordance with the present invention.

Circuitry 34 for performing a global erase while maintaining the maximum voltage across the gate oxides of previously erased transistors 12 below a predetermined maximum acceptable voltage level is shown in FIG. 2. EEPROM transistors 36 have sources 38, drains 40, floating gates 42, and control gates 44. EEPROM transistors 36 form EEPROM array 46, which may be part of a programmable logic device, EEPROM memory, or other integrated circuit.

To perform a global erase of all of transistors 36 in array 46, erase voltages are concurrently applied to control gates 44 via lines 45 and sources 38 via lines 39. Applying the control gate erase voltage and source line erase voltage concurrently allows the maximum voltage across the gate oxide of previously erased transistors 36 to be maintained below a predetermined maximum acceptable voltage level (e.g., approximately 9 V for gate oxides having thicknesses of 125 Å).

The control gate erase voltage is generated by control gate erase circuitry 48. The source line erase voltage is generated by source line erase circuitry 50. Control gate erase circuitry 48 contains high voltage control circuitry 52 for generating the erase voltages applied to control gates 44 and contains discharge circuitry 54 for removing the erase voltages from control gates 44 once erasing is complete. Source line erasing circuitry 50 contains high voltage control circuitry 56 for generating the erase voltages applied to sources 38 and contains discharge circuitry 58 for removing the erase voltages from sources 38 once erasing is complete.

High voltage control circuitry 52 is preferably provided with a supply voltage of 12.5 V at HV_Supply input 60. In order to raise the voltage level at output 60 of high voltage control circuitry 52 to the 15 V level needed to erase transistors 36, high voltage control circuitry 52 preferably contains a charge pump, which supplies an additional 2.5 V bias.

The voltage at output 62 of high voltage control circuitry 52 in control gate erase circuitry 48 is controlled by a control voltage applied to HV_Control input 64. When a logical high voltage (e.g., 5 V) is applied to input 64, the voltage at output 62 is raised to 15 V. This 15 V erase voltage is applied to control gates 44 in array 46 via lines 64. During normal operation (when it is not desired to apply an erase voltage to control gates 44) a logical low voltage (e.g., 0 V) is applied to input 64, which causes the voltage at output 62 to be maintained at 0 V (or whatever the normal bias voltage for input 62 is).

The voltage at output 66 of high voltage control circuitry 56 in source line erase circuitry 50 is determined by the voltage applied to control input 68. Preferably, the control signal applied to control input 68 is the output voltage signal from output 62 of high voltage control circuitry 52. With this arrangement, the voltage at output 66 rises in proportion to the voltage at output 62, so that the control gate erase voltage on control gates 44 rises concurrently with the source line erase voltage on sources 38. As the voltage at output 62 rises from 0 V to 15 V, the voltage at output 66 rises from 0 V to 7 V.

After a sufficient number of electrons have been injected onto floating gates 42 to fully erase transistors 36 in array 46, the control gate and source line erase voltages are removed from transistors 36 using discharge circuitry 54 and 58. The discharge process is controlled by control voltages applied to Discharge_Control input 70. When it is desired to raise the voltages at outputs 62 and 66, a logical low voltage (e.g., 0 V) is applied to input 70. When it is desired to discharge lines 64 and 68 and during normal operation of array 46, a logical high voltage (e.g., 5 V) is applied to input 70.

Discharge circuitry 58 removes the source line erase voltage from sources 38 by discharging source lines 39 through discharge circuitry 58. With this configuration, source lines 39 do not begin to discharge until the magnitude of the control gate erase voltage at input 72 has dropped to the magnitude of the source line erase voltage at input 74 (7 V). After the voltage at input 72 has dropped to 7 V, the voltages on control gates 44 and sources 38 are reduced together until they reach 0 V.

The voltages across the gate oxides of transistors 36 are given by Equations 1–3. Initially, before ramping up the control gate and source line erase voltages, the voltage $V_{S\text{-}FG}$ is −5 V for previously erased transistors. When the full control gate and source line erase voltages (15 V and 7 V, respectively) are applied to transistors 36 at the peak of the erase cycle, the voltage $V_{S\text{-}FG}$ is 0.8 V. Because the source line erase voltage generated at output 66 is proportional to the control gate erase voltage generated at output 62, the maximum magnitude of $V_{S\text{-}FG}$ experienced during the portion of the erase cycle in which the erase voltages are ramping up is 6.4 V (at $V_G=V_S=7V$). The maximum magnitude of $V_{S\text{-}FG}$ experienced during the portion of the erase cycle in which the erase voltages are removed from transistors 36 by discharge circuitry 54 and 58 is 6.4 V, which is the value of $V_{S\text{-}FG}$ when the control gate erase voltage has dropped from 15 V to 7 V and the source line erase voltage is still at 7 V. For a gate oxide thickness of 125 Å, the maximum acceptable voltage across the gate oxides of previously erased transistors 36 is approximately 9 V. The global erase process implemented using circuitry 34 exhibits a maximum voltage across the gate oxides of previously erased transistors of 6.4 V during erasing, well below the 9 V acceptable maximum.

If desired, different approaches can be used for applying and removing the control gate and source line erase voltages, provided that the maximum voltage across the gate oxide is maintained below a predetermined maximum acceptable voltage level (such as 9 V for gate oxides of 125 Å thickness). For example, discharge circuitry that discharges the control gate erase voltage in proportion to the discharge of the source line erase voltage could be used, rather than circuitry 34, which discharges the source line and control gate erase voltages together only after the control gate erase voltage has dropped to equal that of the source line erase voltage.

The foregoing is merely illustrative of the principles of this invention and various modifications can be made by those skilled in the art without departing from the scope and spirit of the invention.

What is claimed is:

1. Circuitry for performing a global erase of an array of electrically-erasable programmable read-only memory (EEPROM) transistors each of which has a control gate, a floating gate, a source, and a gate oxide, said array containing at least one previously erased EEPROM transistor, comprising:
   circuitry for applying a control gate erase voltage to said control gates and a source line erase voltage to said sources while ensuring that the maximum voltage across the gate oxide of said previously erased EEPROM transistor is less than a predetermined maximum acceptable voltage level; and
   circuitry for removing said control gate erase voltage from said control gates and said source line erase voltage from said sources while ensuring that the maximum voltage across the gate oxide of said previously erased EEPROM transistor is less than said predetermined maximum acceptable voltage level, wherein said predetermined maximum acceptable voltage level is less than the maximum voltage to which the gate oxide of the previously erased transistor is subjected when erased by applying the source line erase voltage prior to the control gate erase voltage.

2. The circuitry defined in claim 1 wherein said circuitry for applying said control gate erase voltage and said source line erase voltage comprises:
   control gate high voltage control circuitry for generating said control gate erase voltage as an output; and
   source line high voltage control circuitry for generating said source line erase voltage, wherein:
      said control gate high voltage control circuitry is controlled by a high voltage input control signal; and
      said source line high voltage control circuitry is controlled by the output of said control gate high voltage control circuitry.

3. The circuitry defined in claim 2 wherein said source line erase voltage that is generated by said source line high voltage control circuitry is proportional to said control gate erase voltage.

4. The circuitry defined in claim 1 wherein said circuitry for removing said control gate erase voltage and said source line erase voltage comprises:
   control gate discharge circuitry for discharging said control gate erase voltage; and
   source line discharge circuitry for discharging said source line erase voltage, said source line discharge circuitry discharging said source line erase voltage through said control gate discharge circuitry.

5. The circuitry defined in claim 4 wherein said source line erase voltage is discharged in proportion to said control gate erase voltage after said control gate erase voltage has been discharged to be equal in magnitude to said source line erase voltage.

6. A method for performing a global erase of an array of electrically-erasable programmable read-only memory (EEPROM) transistors each of which has a control gate, a floating gate, a source, and a gate oxide, said array containing at least one previously erased EEPROM transistor, comprising the steps of:
   applying a control gate erase voltage to said control gates and a source line erase voltage to said sources while ensuring that the maximum voltage across the gate oxide of said previously erased EEPROM transistor is less than a predetermined maximum acceptable voltage level; and
   removing said control gate erase voltage from said control gates and said source line erase voltage from said sources while ensuring that the maximum voltage across the gate oxide of said previously erased EEPROM transistor is less than said predetermined maximum acceptable voltage level, wherein said predetermined maximum acceptable voltage level is less than the maximum voltage to which the gate oxide of the previously erased transistor is subjected when erased by applying the source line erase voltage prior to the control gate erase voltage.

7. The method defined in claim 6 wherein said step of applying said control gate erase voltage and said source line erase voltage comprises the steps of:

generating said control gate erase voltage as an output with control gate high voltage control circuitry; and generating said source line erase voltage with source line high voltage control circuitry;

controlling said control gate high voltage control circuitry with a high voltage input control signal; and controlling said source line high voltage control circuitry with the output of said control gate high voltage control circuitry.

8. The method defined in claim 7 wherein said step of generating said source line erase voltage comprises the step of generating said source line erase voltage in proportion to said control gate erase voltage.

9. The method defined in claim 6 wherein said step of removing said control gate erase voltage and said source line erase voltage comprises the steps of:

discharging said control gate erase voltage with control gate discharge circuitry; and discharging said source line erase voltage with source line discharge circuitry through said control gate discharge circuitry.

10. The method of claim 9 wherein said steps of discharging said control gate and source line erase voltages comprise the steps of:

discharging said control gate erase voltage until it is equal in magnitude to said source line erase voltage; and discharging said source line erase voltage in proportion to said control gate erase voltage.

* * * * *